April 26, 1966 E. WEISSHAAR ET AL 3,248,615

SEMICONDUCTOR DEVICE WITH LIQUIDIZED SOLDER LAYER FOR
COMPENSATION OF EXPANSION STRESSES

Filed May 13, 1963

INVENTORS
Erich Weisshaar
Dieter Spickenreuther
BY Franz Brischnik

Pierce, Scheffler & Parker
Attorneys 3,248,615
Patented Apr. 26, 1966

3,248,615

SEMICONDUCTOR DEVICE WITH LIQUIDIZED SOLDER LAYER FOR COMPENSATION OF EXPANSION STRESSES

Erich Weisshaar and Dieter Spickenreuther, Baden, and Franz Brischnik, Neuenhof, Switzerland, assignors to Aktiengesellschaft Brown, Boveri & Cie., Baden, Switzerland, a joint-stock company Filed May 13, 1963, Ser. No. 279,795
11 Claims. (Cl. 317—234)

Figure 1:
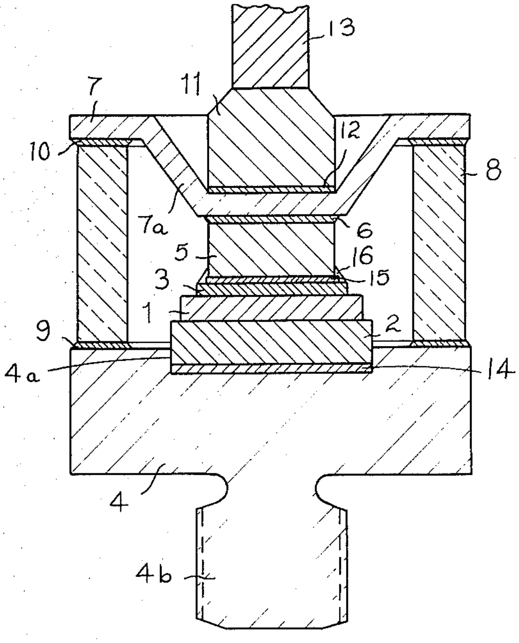

This invention relates to a semiconductor device in which the semiconductor element having large surfaces on both sides is pressed under slight pressure onto plane surfaces of metal bodies.

For the supply of current and above all for the removal of waste heat generated in the semiconductor element, the element must be in good electrical and thermal contact with metal bodies, as, for example, the base of a housing and a current supply bolt or wire. The connection of the semiconductor element with these parts is made, as known, by solder. As well as providing a good contact, the solder must fulfill partly contradictory requirements. Since any heavy mechanical stress on the semiconductor elements should be eliminated, the use of soft, ductile, solders appears suitable, especially in conjunction with a carrier plate, soldered onto the semiconductor element, whose coefficient of thermal expansion is substantially equal to that of the element e.g. with a carrier plate of molybdenum or tungsten when the element is of silicon. With such a device, the forces arising due to the different coefficients of thermal expansion of the carrier plate and the metal body joined to it are taken up by the soft solder layer between the two. With varying thermal stresses on the device, there now appear fatigue symptoms in the solder junction due to plastic flow and recrystallization processes, which symptoms lead to separation of the joint and spoiling of the semiconductor device.

Many proposals have already been made for the avoidance of these disadvantages. In particular, it is known to join the metal body and the carrier plate with a hard solder layer which, due to the continuous internal stresses, is not permanently deformed. So that these internal stresses are transferred to the metal body, the carrier plate must have a considerable thickness. Due to this, however, the heat transfer from the semiconductor element to the metal body, which serves as a heat sink, is worsened. Above all, however, it is disadvantageous that the high temperatures required for hard soldering operate destructively on the electrical blocking properties of the element, either by vapourization of solder and housing materials or by diffusion of the metal of the housing e.g. copper, into the semiconductor, or else by alteration of the outer surface state of the element itself.

The semiconductor device according to the invention in which the semiconductor element having large surfaces on both sides is pressed under slight pressure onto plane surfaces of metal bodies, is characterized in that the semiconductor element is joined to the metal bodies by a solder which at the proposed operating temperature of the semi-conductor device is in a fluid state.

A more specific object of the invention is to provide an improved semiconductor apparatus which comprises a thin disc of semiconductor material and two electrically conductive metal bodies between which the semiconductor disc is placed and electrically connected. Pressure is applied at least indirectly between the faces of the metal bodies and the opposite faces of the semiconductor disc and a thin layer of electrically conductive solder is placed between the face of each metal body and the corresponding face of the semiconductor disc, these solder layers being in a liquid state at least during the time that the semiconductor apparatus is carrying current.

If supporting or reinforcing plates are provided at one or both faces of the semiconductor disc and thus lie intermediate the metal bodies and semiconductor disc, then the layer of liquefiable solder lies between the outer faces of these support plates and the metal bodies.

Moreover, if the metal bodies are made of a material which tends to be dissolved by contact with the liquid solder, then the material so dissolved in the solder tends to appreciably harden the solder and thus impair its advantageous property of being liquid and not affected by thermal mechanical stress. A combination of copper as the metal body material and gallium as the liquefiable solder would exhibit this tendency to dissolve copper into the gallium. In such cases, it is preferred in accordance with the invention to protect the metal body material against solution in the solder by covering the body surface with a thin metal layer which itself is incapable of forming alloys or compounds with the solder layer thus establishing an effective barrier between the metal body and the solder.

A further aspect of the basic inventive concept of utilizing a layer of liquifiable solder is the provision of a ring surrounding the solder so as to keep it from spreading out.

The connection of the semiconductor element with the indirectly abutting metal bodies by the fluid solder provides a very good electrical and thermal transfer. Fatigue symptoms in the solder are completely excluded, and also the mechanical stressing of the semiconductor element due to the different coefficients of thermal expansion of the semiconductor element and the metal body is rendered impossible. At extremely low ambient temperatures and small electrical load on the element, the solder can solidify and form a rigid joint. This is, however, in no way disadvantageous as in the known soft solder joints. At low loads, only very small mechanical forces arise. At higher loads, the temperature of the element rises so that the solder melts and thus the completely free electrical, thermal and mechanical transfer is achieved.

The objects and advantages of the invention will become more apparent from the following detailed description of two embodiments of semiconductor devices which incorporate the liquefiable solder layers between the semiconductor element and the metal bodies at the opposite sides thereof.

In the first of these embodiments as represented in FIG. 1, which is a view in central vertical section, the liquefiable solder lies in direct contact with the metal bodies. In the second embodiment, as showin in FIG. 2, which is also a view in central vertical section, a barrier layer of a metal which itself is incapable of forming alloys or compounds with the solder layer and thus is not dissolved in the solder, is placed between the surface of the metal body and the solder layer.

With reference now to the drawings and to FIG. 1 in particular, which discloses an embodiment of the invention wherein the semiconductor device is constructed as a plate type rectifier, the semiconductor element is constituted as a p-n junction type disc 1 of silicon which preferably has a carrier or support plate 2 soldered to the lower face thereof in order to reinforce the silicon disc which is very thin and fragile. Molybdeum or tungsten is chosen for the carrier plate material since their coefficient of thermal expansion is substantially the same as the silicon. A top electrode plate 3 of gold is preferably secured to the upper face of the silicon disc. The thickness of all three of these components 1–3 of the disc assembly has been exaggerated for the sake of clarity. Plates 2 and 3 are electrically conductive and the material of each is such as will render it incapable of forming alloys or compounds of the material from which is made the liquefiable solder layer, to be later described, and which is in contact with that face of the plate opposite the face engaging the face of the semiconductor disc 1.

Carrier plate 2 is received in a recess *4a* of a relatively massive electrically conductive metal body 4 which forms the base of a housing for the rectifier disc assembly, this base being provided with a threaded stud part *4b* by which the base may be screwed into another body, not shown, which serves to support the entire rectifier assembly and also serves to remove heat generated during operation of the rectifier.

Preferably, the recess *4a* has a configuration and size generally matching that of the carrier plate 2 so that the latter will be snugly received in the recess. Moreover, if desired, a bead of the base material could be formed over the edge of the carrier plate.

The upper side of the gold electrode plate 3 faces an electrically conductive terminal bolt 5 which is secured by a layer of hard solder 6 to the underside of an electrically conductive metallic housing cover 7 which, as shown in the drawing, has a centrally depressed part *7a* which serves to apply through bolt 5 an adequate amount of compression upon the elements which make up the rectifier disc assembly.

To complete a gas-tight housing around the rectifier disc assembly, a cylindrical sleeve 8 of ceramic material is used. The bottom of sleeve 8 is secured to base 4 by a ring-shaped solder layer 9 suitable for joining metal and ceramic and a similar ring-shaped solder layer 10 is used at the top of the sleeve for joining it to the underside of the rim of cover 7.

An upper electrically conductive terminal piece 11 is secured by a layer of hard solder 12 to the upper side of the centrally depressed part *7a* of cover 7, and a connection cable 13 is secured to terminal 11.

In accordance with the invention, a layer of solder which will be in a fluid state at least during the time that the rectifier device is carrying current at its normal temperature level above ambient is located between each side of the rectifier disc assembly and the corresponding metal body. In the embodiment of FIG. 1, the metal bodies are the terminal bolt 5 and base 4 and the rectifier disc assembly is comprised of the silicon disc 1, carrier plate 2 and gold electrode plate 3. These liquefiable solder layers are indicated at 14 and 15, the layer 14 being located in the base recess *4a* in contact with the underside of carrier plate 2 and the layer 15 being located between the upper side of gold electrode 3 and the underside of terminal bolt 5.

Suitable solder materials for the layers 14, 15 are metals and alloys which become fluid at a mean operating temperature in the range from about 30 to 130° C. For example, gallium is a suitable material since it melts at about 29.8° C. Mercury has also proved to be a suitable material.

For semiconductor devices that are subject to only small acceleration forces, the fluid solders will be prevented from flowing outwardly merely by capillary forces and surface tension. However, in semiconductor devices that are subject to high acceleration forces, such as those used as semiconductor rectifiers in vehicles, which produce jolting movements, it is advantageous to coat the periphery of the solder layer with a lacquer. In the embodiment of FIG. 1, since the lower solder layer 14 lies within a recess *4a*, outward flow of the solder is not possible and hence, presents no problem. However, the upper solder layer 15 has no such inherent peripheral confining means and hence, it is preferable in the situation mentioned where high acceleration forces are present to coat the periphery of solder layer 15 with a lacquer layer 16. A suitable lacquer for this purpose is a silicon lacquer of known composition which is used in the production of semiconductor devices and which does not diffuse into the semiconductor element itself.

Figure 2:
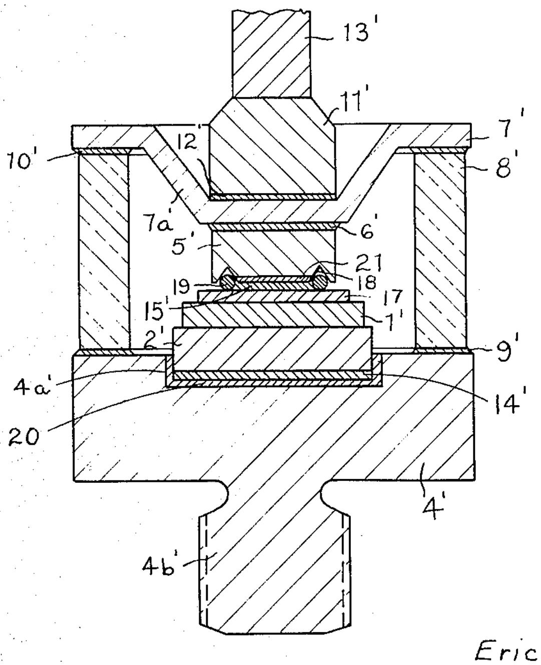

In the embodiment of FIG. 2, which is somewhat similar to that of FIG. 1, those component parts which are like those of FIG. 1 have been given the same reference numerals but with primes added for purposes of distinction. The FIG. 2 embodiment differs from that of FIG. 1 in that the gold electrode layer 3 of the latter is replaced with an upper carrier or supporting plate 17 which is made from molybdenum or tungsten and the lower face of terminal bolt 5' is provided with a V-shaped circular groove 18 which receives a sealing ring 19. Suitable materials for ring 19 are silicon rubber or lead and it will be seen that ring 19 contacts the upperside of carrier plate 17 and thus confines the liquefiable solder layer 15'.

If those metal bodies such as *4'* and *5'* which would ordinarily come into contact with the solder layers 14', 15' are made from a material such as copper, and the solder material is one such as, for example, gallium, part of the copper will tend to be dissolved in the gallium when it becomes melted. Any copper dissolved in the gallium results in the disadvantage that the solder is appreciably hardened and hence, loses its desired characteristic of being fluid and not impaired by thermal mechanical stress. To remedy this situation, the metal bodies should be covered by a thin electrically conductive metallic layer which is incapable of forming alloys or compounds with the solder layer. A suitable material for this layer is molybdenum or tungsten and hence, such a layer 20 is applied as a liner to the walls of recess *4a'* in the copper body 4 and thus produces an effective barrier between the liquefiable solder layer 14' and the copper body 4. Another layer 21 of molybdenum or tungsten is similarly applied to the underface of the copper terminal bolt 5' so as to form a barrier between the latter and the surface of the other liquefiable solder layer 15'. The protective layers 20, 21 have no mechanical function and hence, they can be made very thin and applied to the surfaces by any suitable means such as an evaporative process. Since the carrier or support plates 2' and 17 for the semiconductor disc 1' are also made of molybdenum or tungsten there is, of course, no barrier problem presented at the surfaces of the liquefiable solder layers which lie in contact with these plates.

While the carrier plates for the silicon semiconductor disc are usually preferred so as to provide structural reinforcement for the disc, these plates are not essential from an electrical point of view. Should they not be included, then it is preferred to isolate the surface of the liquefiable solder layer from direct contact with the surfaces of the semiconductor disc by interposing a barrier layer which will not form any compounds or alloys with the solder. A suitable material for such barrier layers would be gold.

In conclusion, while the invention has been described and illustrated in its application to a semiconductor surface rectifier, it is equally applicable for other semiconductor devices with flat surface electrodes such as power transistors and controlled semiconductor rectifiers.

We claim:

1. In a semiconductor apparatus, the combination comprising a thin disc of semiconductor material and including oppositely disposed substantially plane and parallel faces, a pair of electrode plates applied to the opposite faces of said semiconductor disc to reinforce the same and establish a semiconductor disc assembly, a pair of electrically conductive metallic bodies between which said semiconductor disc assembly is located, means applying a pressure to said semiconductor disc assembly from at least one of said metallic bodies, and a layer of solder which is in a liquid state at least at the operating temperature of said apparatus interposed between one of said metallic bodies and one of said electrode plates for transmitting the pressure forces to said semiconductor disc assembly, said electrode plate which lies between said solder layer and semiconductor disc being made from a material incapable of forming alloys or compounds with the solder material, and said liquid solder layer serving to compensate for such mechanical stresses as would otherwise arise on said semiconductor disc assembly due to differences in expansion coefficients as between said semiconductor disc assembly and said metallic bodies.

2. A semiconductor apparatus as defined in claim 1 wherein a solder layer is disposed between a face of each of said electrode plates and the corresponding face of each said metal body.

3. A semiconductor apparatus as defined in claim 1 wherein said solder layer is a metal of the group consisting of gallium and mercury.

4. A semiconductor apparatus as defined in claim 1 and which further includes a ring-shaped layer of lacquer bounding the edge surface of said solder layer for confining the same.

5. A semiconductor apparatus as defined in claim 1 and which further includes a sealing ring bounding the edge surface of said solder layer for confining the same.

6. A semiconductor apparatus as defined in claim 5 wherein said semiconductor disc is made from silicon and said sealing ring is a material taken from the group consisting of silicon rubber and lead.

7. A semiconductor apparatus as defined in claim 1 and which further includes a sealing ring bounding the edge surface of said solder layer for confining the same, said ring being disposed in a ring-shaped recess in the face of said metal body.

8. A semiconductor apparatus as defined in claim 1 wherein said solder layer lies in direct contact with the face of said metal body.

9. In a semiconductor apparatus, the combination comprising a thin disc of silicon semiconductor material, and including oppositely disposed substantially plane and parallel faces, a gold electrode plate applied to one face of said semiconductor disc, a carrier plate applied to the opposite face of said semiconductor disc, said carrier plate being made from a metal of the group consisting of molybdenum and tungsten, said electrode and carrier plates serving to reinforce said semiconductor disc and establish a semiconductor disc assembly, a pair of electrically conductive metallic bodies between which said semiconductor disc assembly is located, means applying a pressure to said semiconductor disc assembly from said metalic bodies, and solder layers interposed respectively between each of said metallic bodies and the corresponding electrode and carrier plates for transmitting the pressure forces to said semiconductor disc assembly, said solder layers being a metal from the group consisting of gallium and mercury so as to be in a liquid state at least at the operating temperature of said semiconductor apparatus and serving to compensate for such mechanical stresses as would otherwise arise on said semiconductor disc assembly due to differences in expansion coefficients as between said semiconductor disc assembly and said metallic bodies.

10. In a semiconductor apparatus, the combination comprising a thin disc of silicon semiconductor material and including oppositely disposed substantially plane and parallel faces, a pair of carrier plates applied respectively to opposite faces of said semiconductor disc, said carrier plates being made from a metal of the group consisting of molybdenum and tungsten and serving to reinforce said semiconductor disc and establish a semiconductor disc assembly, a pair of electrically conductive metallic bodies between which said semiconductor disc assembly is located, means applying a pressure to said semiconductor disc assembly from said metallic bodies, and solder layers interposed respectively between each of said metallic bodies and the corresponding carrier plate for transmitting the pressure forces to said semiconductor disc assembly, said solder layers being a metal from the group consisting of gallium and mercury so as to be in a liquid state at least at the operating temperature of said semiconductor apparatus and serving to compensate for such mechanical stresses as would otherwise arise on said semiconductor disc assembly due to differences in expansion coefficients as between said semiconductor disc assembly and said metallic bodies.

11. A semiconductor apparatus as defined in claim 10 wherein said metallic bodies are made from copper and which further includes a metallic barrier layer interposed between each said carrier plate and the corresponding metallic body and which is selected from the group consisting of molybdenum and tungsten.

References Cited by the Examiner

UNITED STATES PATENTS

| | | | |
|---|---|---|---|
| 1,122,358 | 12/1914 | Barr | 317—236 |
| 2,734,154 | 2/1956 | Pankove | 317—234 |
| 2,735,050 | 2/1956 | Armstrong | 317—235 |
| 2,874,340 | 2/1959 | Lehovec | 317—236 |
| 2,922,092 | 1/1960 | Gazzara et al. | 317—234 |
| 2,956,214 | 10/1960 | Herbst | 317—234 |
| 3,128,419 | 4/1964 | Waldkotter et al. | 317—234 |

JOHN W. HUCKERT, *Primary Examiner.*

DAVID J. GALVIN, *Examiner.*

A. M. LESNIAK, *Assistant Examiner.*